(12) United States Patent
Nagano et al.

(10) Patent No.: US 7,109,501 B2
(45) Date of Patent: Sep. 19, 2006

(54) CHARGED PARTICLE BEAM LITHOGRAPHY SYSTEM, PATTERN DRAWING METHOD, AND METHOD OF MANUFACTURING SEMICONDUCTOR DEVICE

(75) Inventors: Osamu Nagano, Kanagawa (JP); Atsushi Ando, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/959,508

(22) Filed: Oct. 7, 2004

(65) Prior Publication Data
US 2005/0109955 A1 May 26, 2005

(30) Foreign Application Priority Data
Oct. 8, 2003 (JP) .............................. 2003-349294

(51) Int. Cl.
*H01J 37/08* (2006.01)
*H01J 37/30* (2006.01)
*A61N 5/00* (2006.01)

(52) U.S. Cl. .............................. 250/492.22; 250/492.1; 250/492.2; 250/492.21; 250/306; 250/307; 250/309

(58) Field of Classification Search ......... 250/492.1–3, 250/492.21–23, 306, 307, 309–311
See application file for complete search history.

(56) References Cited

U.S. PATENT DOCUMENTS 5,051,556 A * 9/1991 Sakamoto et al. ..... 219/121.25

(Continued)

FOREIGN PATENT DOCUMENTS

JP       59-000838        1/1984

(Continued)

OTHER PUBLICATIONS

H. Sunaoshi, et al.; "Election Beam Calibration Method for Character Projection Exposure System EX-8D", Jpn. J. Appl. Phys. vol. 34, pp. 6679-6683 (1995).

*Primary Examiner*—John R. Lee
*Assistant Examiner*—Bernard E. Souw
(74) *Attorney, Agent, or Firm*—Finnegan, Henderson, Farabow, Garrett & Dunner, L.L.P.

(57) ABSTRACT

A charged particle beam lithography system includes: a charged particle beam source which generates a charged particle beam and irradiates a substrate therewith; an aperture in which has been formed a pattern of a shape corresponding to an arbitrary pattern to be drawn; an illuminator which adjusts the diameter of the charged particle beam and illuminates the aperture with the charged particle beam; a first deflector which deflects the charged particle beam by an electrical field to cause the charged particle beam to be incident on an arbitrary pattern, allowing the charged particle beam to pass through the aperture and be reflected back along the optical axis; a first demagnification optical projection system which demagnifies the aperture image of the charged particle beam which has passed through the aperture with the use of an electrical field or electromagnetic field; a second demagnification optical projection system which demagnifies the aperture image of the charged particle beam which has been demagnified by the first demagnification projection optical system, with the use of an electrical field or electromagnetic field to form an image on the substrate; and a beam diameter adjuster which adjusts the illuminator in such a manner that the beam diameter at crossovers of the charged particle beam, formed between the aperture and the first demagnification optical projection system and within the second demagnification optical projection system, is greater than the size of the pattern.

20 Claims, 3 Drawing Sheets

U.S. PATENT DOCUMENTS

| | | | | |
|---|---|---|---|---|
| 5,173,582 | A * | 12/1992 | Sakamoto et al. | 219/121.25 |
| 5,557,314 | A * | 9/1996 | Okamoto et al. | 347/230 |
| 5,757,409 | A * | 5/1998 | Okamoto et al. | 347/230 |
| 5,831,270 | A * | 11/1998 | Nakasuji | 250/396 ML |
| 6,355,383 | B1 * | 3/2002 | Yamashita | 430/5 |
| 6,393,604 | B1 * | 5/2002 | Yamada et al. | 716/21 |
| 6,465,783 | B1 * | 10/2002 | Nakasuji | 250/311 |
| 6,633,366 | B1 * | 10/2003 | de Jager et al. | 355/67 |
| 6,677,088 | B1 * | 1/2004 | Magome et al. | 430/5 |
| 6,777,697 | B1 * | 8/2004 | Yui et al. | 250/492.22 |
| 6,815,698 | B1 * | 11/2004 | Nagano et al. | 250/492.22 |
| 6,940,080 | B1 * | 9/2005 | Nagano et al. | 250/492.23 |
| 2002/0033458 | A1 * | 3/2002 | Nagano et al. | 250/492.1 |
| 2002/0054284 | A1 * | 5/2002 | de Jager et al. | 355/67 |
| 2002/0148961 | A1 * | 10/2002 | Nakasuji et al. | 250/311 |
| 2002/0187406 | A1 * | 12/2002 | Magome et al. | 430/5 |
| 2003/0025088 | A1 * | 2/2003 | Oae et al. | 250/492.23 |
| 2003/0043357 | A1 * | 3/2003 | Shimoda | 355/53 |
| 2003/0094584 | A1 * | 5/2003 | Yui et al. | 250/492.22 |
| 2003/0206283 | A1 * | 11/2003 | de Jager et al. | 355/67 |
| 2004/0029046 | A1 * | 2/2004 | Nagano et al. | 430/296 |
| 2004/0169832 | A1 * | 9/2004 | Shimoda | 355/30 |
| 2005/0109955 | A1 * | 5/2005 | Nagano et al. | 250/492.21 |
| 2005/0139789 | A1 * | 6/2005 | Nagano et al. | 250/492.23 |
| 2005/0199821 | A1 * | 9/2005 | Saini et al. | 250/398 |

FOREIGN PATENT DOCUMENTS

| | | |
|---|---|---|
| JP | 6-290727 | 10/1994 |
| JP | 7-142318 | 6/1995 |
| JP | 2000-173529 | 6/2000 |
| JP | 2001-102295 | 4/2001 |

* cited by examiner

CHARGED PARTICLE BEAM LITHOGRAPHY SYSTEM, PATTERN DRAWING METHOD, AND METHOD OF MANUFACTURING SEMICONDUCTOR DEVICE

CROSS REFERENCE TO RELATED APPLICATION

This application claims benefit of priority under 35USC §119 to Japanese Patent Application No. 2003-349294, filed on Oct. 8, 2003, the contents of which are incorporated by reference herein.

BACKGROUND OF THE INVENTION

1. Field of the Invention

The present invention relates to a charged particle beam lithography system, a pattern drawing method using a charged particle beam, and a method of manufacturing a semiconductor device.

2. Related Background Art

A charged particle beam lithography system can draw a pattern at a high resolution on the order of the wavelength of charged particles (such as electrons or ions) that is shorter than the visible wavelengths. Unlike a mask drawing method using light exposure, however, this method has a problem in that the complete pattern is divided into small sections and then is directly drawn by a beam of such a divided pattern, so that the drawing in this charged particle beam lithography system takes a long time. Since such a charged particle beam lithography system has the characteristic of enabling the formation fine line patterns to a high level of precision, however, it is being developed as the next-generation technique after lithography by optical exposure methods, or as a powerful tool for the manufacture of small lots of varied devices such as application specific integrated circuits (ASICs). Methods of forming a direct pattern by an electron beam include a method of scanning the wafer entire surface with a small round beam while turning the beam on and off, and a VSB drawing method of drawing a pattern with an electron beam that has passed through a stencil aperture. An electron beam drawing technique has been disclosed as a development from the VSB drawing method (such as in Japanese Patent Laid-Open No. 6-290727, Japanese Patent Laid-Open No. No. 2000-173529, Jpn. J. Appl. Phys. Vol. 34 (1995) Pt. 1, No. 12B, J. Vac. Sci. Technol. B 15 (6), November/December 1997, and J. Vac. Sci. Technol. B 19 (6), November/December 2001) to enable rapid drawing in batches. In this method, a stencil is prepared in which is formed a pattern consisting of a plurality of blocks of a repeating pattern, and this stencil is used for selective drawing.

In the VSB method that is disclosed in Jpn. J. Appl. Phys. Vol. 34 (1995) Pt. 1, No. 12B, an electron beam that has been accelerated to a high acceleration is driven into a resist layer on a wafer to ensure an improved beam resolution. With this high-acceleration voltage method, a phenomenon called the proximity effect occurs in which the irradiating electron beam reflects from the various layers of thin films formed on the lower surface of the resist on the upper surface of a wafer and is again directed through the resist, which leads to blurriness of the pattern to be drawn and a deterioration in the resolution. In this electron beam lithography system of this high-acceleration voltage method, it is therefore essential to exert control to correct this proximity effect, necessitating large-scale systems not only for the electronic optical system but also for the control itself. As a result, the system becomes even more complex, leading to a further problem in that the precision effectively deteriorates. In addition, the use of highly accelerated electrons leads to a fear that the surface of the wafer will become damaged.

To solve this problem with the VSB method when using a high-acceleration voltage charged particle beam, an electron beam drawing method of an aperture style that uses an electron beam with a low-acceleration voltage has been proposed (such as in Japanese Patent Laid-Open No. 2000-173529).

However, both the electron beam lithography system disclosed in Jpn. J. Appl. Phys. Vol. 34 (1995) Pt. 1, No. 12B and the electron beam drawing apparatus disclosed in Japanese Patent Laid-Open No. 2000-173529 have a problem in that a crossover is formed between a second shaping aperture of the optical system and the wafer, at which the diameter of the electron beam becomes small in order to reduce beam blurriness and warping due to optical aberrations. More specifically, the electron beam lithography system disclosed in Jpn. J. Appl. Phys. Vol. 34 (1995) Pt. 1, No. 12B has a high-demagnification optical system of 1/36 and the electron beam drawing apparatus disclosed in Japanese Patent Laid-Open No. 2000-173529 has a demagnification optical system on the order of 1/10. This means that with respect to each apparatus the aperture angle of the beam starting at the second shaping aperture is extremely small, so that the crossover has dimensions of a few micrometers and this is the smallest beam diameter with each demagnification projection optical system.

If an optical system that forms a crossover of such a small beam diameter is employed in an electron beam drawing apparatus using a low-acceleration voltage, a problem arises in that the blurriness of the beam is increased by the space charge effect and thus the resolution deteriorates.

A common problem in the above-described apparatus is that secondary electrons generated from the surface of the wafer cause contamination and charging of the objective lens and the deflector in the vicinity thereof, which results in a further worsening and drifting of the beam blurriness. Note that the usage of the term "secondary electrons" in this document has a broader meaning that includes reflected electrons.

BRIEF SUMMARY OF THE INVENTION

According to a first aspect of the present invention, there is provided a charged particle beam lithography system comprising:

a charged particle beam source which generates a charged particle beam and irradiates a substrate therewith;

an aperture in which has been formed a pattern of a shape corresponding to an arbitrary pattern to be drawn;

an illuminator which adjusts the diameter of the charged particle beam and illuminates said aperture with the charged particle beam;

a first deflector which deflects the charged particle beam by an electrical field to cause the charged particle beam to be incident on an arbitrary pattern, allowing the charged particle beam to pass through said aperture and be reflected back along the optical axis;

a first demagnification optical projection system which demagnifies the aperture image of the charged particle beam which has passed through said aperture with the use of an electrical field or magnetic field;

a second demagnification optical projection system which demagnifies the aperture image of the charged particle beam which has been demagnified by said first demagnification projection optical system, with the use of an electrical field or magnetic field to form an image on the substrate; and a beam diameter adjuster which adjusts said illuminator in such a manner that the beam diameter at crossovers of the charged particle beam, formed between said aperture and said first demagnification optical projection system and within said second demagnification optical projection system, is greater than the size of said pattern.

According to a second aspect of the present invention, there is provided a pattern drawing method using a charged particle beam, said method comprising:

generating a charged particle beam and irradiating a substrate therewith;

shining the charged particle beam onto an aperture on which is formed a pattern of a shape corresponding to an arbitrary pattern to be drawn, by adjusting the diameter of the charged particle beam;

causing the charged particle beam to be incident on said arbitrary pattern by deflecting the charged particle beam by an electrical field, and returning the charged particle beam that has passed through said aperture back along the optical axis thereof;

demagnifying the aperture image of the charged particle beam that has passed through said aperture by a first demagnification with the use of an electrical field or magnetic field;

further demagnifying said aperture image that has been demagnified by said first demagnification, by a second demagnification with the use of an electrical field or magnetic field; and adjusting the diameter of the charged particle beam in such a manner that the diameter of a crossover of the charged particle beam that is formed between passing through said aperture and irradiating the substrate is greater than the dimensions of said pattern.

According to a third aspect of the present invention, there is provided a method of manufacturing a semiconductor device comprising a pattern drawing method using a charged particle beam, said pattern drawing method including:

generating a charged particle beam and irradiating a substrate therewith;

shining the charged particle beam onto an aperture on which is formed a pattern of a shape corresponding to an arbitrary pattern to be drawn, by adjusting the diameter of the charged particle beam;

causing the charged particle beam to be incident on said arbitrary pattern by deflecting the charged particle beam by an electrical field, and returning the charged particle beam that has passed through said aperture back along the optical axis thereof;

demagnifying the aperture image of the charged particle beam that has passed through said aperture by a first demagnification with the use of an electrical field or magnetic field;

further demagnifying said aperture image that has been demagnified by said first demagnification, by a second demagnification with the use of an electrical field or magnetic field; and adjusting the diameter of the charged particle beam in such a manner that the diameter of a crossover of the charged particle beam that is formed between passing through said aperture and irradiating the substrate is greater than the dimensions of said pattern.

DETAILED DESCRIPTION OF THE INVENTION

An embodiment of the present invention is described below with reference to the accompanying figures. The description below relates to the use of an electron beam as the charged particle beam but the present invention is not limited thereto and thus it is of course possible to use an ion beam as the charged particle beam, by way of example.

Figure 1:
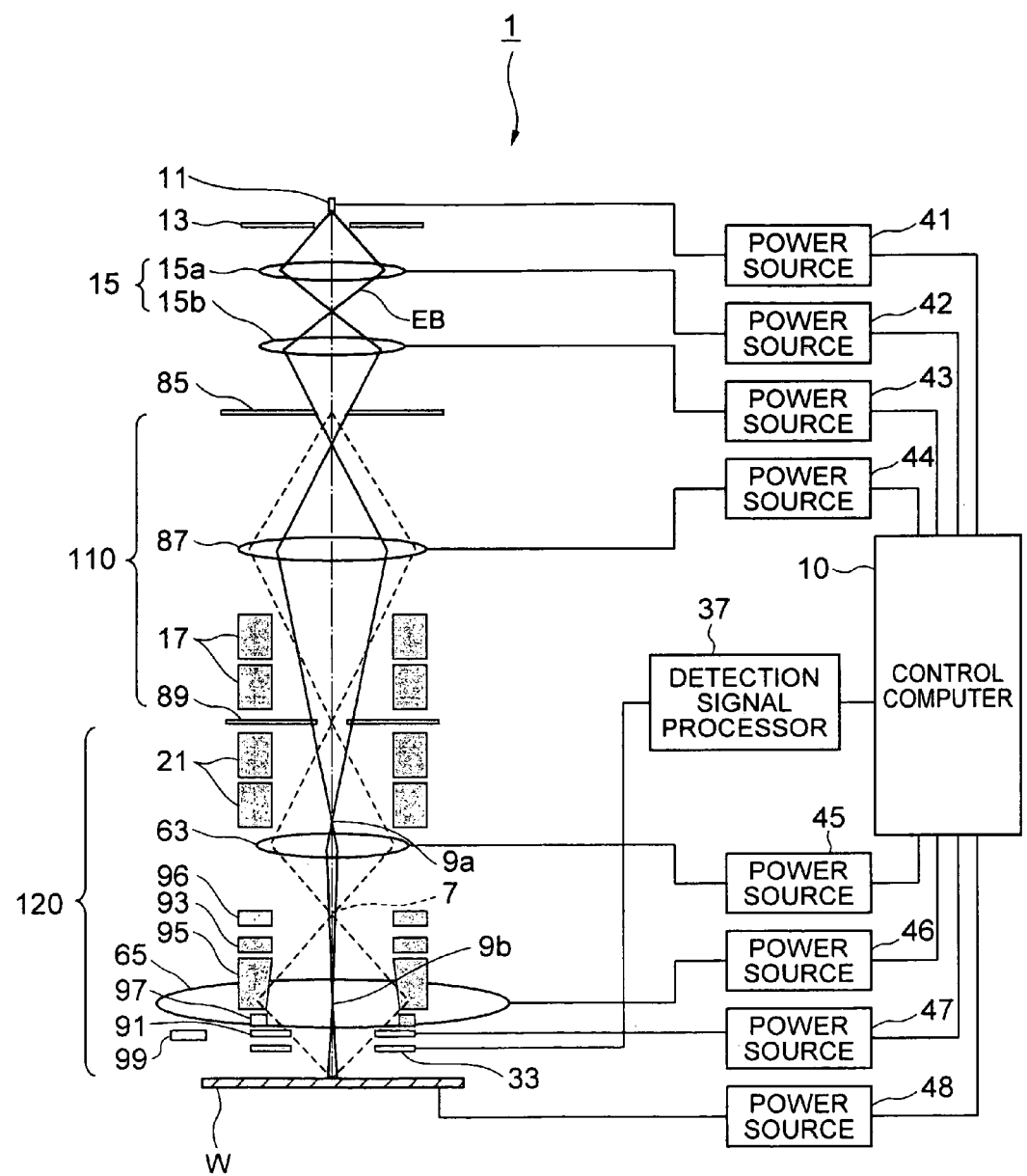
FIG. 1 is a block diagram of an embodiment of the charged particle beam lithography system in accordance with the present invention.

A block diagram of an embodiment of the charged particle beam lithography system in accordance with the present invention is shown in FIG. 1. An electron beam drawing system 1 shown in this figure is a charged particle beam lithography system that implements an embodiment of the pattern drawing method in accordance with the present invention, comprising an electronic optical system and a controller.

The controller includes a control computer 10 that controls the entire system, power sources 41 to 48, and a detection signal processor 37. The detection signal processor 37 processes a secondary electron signal that has been detected by a secondary electron detector 33, which will be described later, and provides the control computer 10 with the processed result. The control computer 10 outputs SEM images obtained by processing the detected secondary electron signal and also controls a voltage that is applied to an illumination lens 15 to adjust the illumination conditions of an electron beam EB onto a second shaping aperture (cell aperture) 89. This function of the control computer 10 will be discussed later in more detail.

The electronic optical system includes an electron gun 11 that causes the generation of the electron beam EB, a first aperture 13 having a rectangular or circular opening, the illumination lens 15 (15a and 15b) that adjusts the diameter of the electron beam EB, demagnification projection optical systems 110 and 120, and a laser displacement sensor 99. The illumination lens 15 is configured of two electrostatic lens ("Einzel" lens) 15a and 15b each of which have a plurality of electrodes and are used by the application of a negative voltage to the intermediate electrode. The illumination lens 15 adjusts the magnification of the electron beam EB so that the electron beam EB has a requisite diameter sufficient to the opening of the first shaping aperture 85.

The demagnification optical projection system 110 has the first shaping aperture 85, which has a rectangular aperture, a projection lens 87 configured of an electrostatic lens, and a first shaping deflector 17. The first shaping deflector 17 controls the deflection of the electron beam EB in such a manner that the electron beam EB having passed through the second shaping aperture 87 is incident on an arbitrary cell pattern of a second shaping aperture 89, as will be described later.

In addition to the second shaping aperture 89, a second shaping deflector 21 that returns the electron beam EB that has passed through the second shaping aperture 89 back along the optical axis, a reduction lens 63 that reduces the electron beam EB and an objective lens 65 that forms an image of the electron beam EB on a wafer W, the demagnification optical projection system 120 has a pre-main deflector 96, a sub deflector 93, a main deflector 95, a post-main deflector 97, a control electrode 91 and the secondary electron detector 33. A plurality of cell apertures are arrayed in the second shaping aperture 89 in accordance with the shape of the arbitrary pattern to be drawn. In this embodiment the objective lens 65 is configured of a magnetic lens in which the inside diameter of the lower pole of the polepiece is greater than the inside diameter of the upper pole thereof. The pre-main deflector 96, the main deflector 95, and the post-main deflector 97 control the deflection of the electron beam EB so that it scans a region to be drawn (stripe) of the wafer W that is supported by an XY stage (not shown in the figure), while referencing positions on the XY stage. The sub deflector 93 controls the position at which the electron beam EB is incident, with respect to an area to be drawn into which the abovementioned stripe has been divided finely. The secondary electron detector 33 detects secondary electrons generated from the wafer W by the illumination of the electron beam EB. The control electrode 91 is provided between the post-main deflector 97 and the secondary electron detector 33, and a voltage that is further toward the negative side than that applied to the wafer W is applied thereto from a power source 47. This prevents the secondary electrons generated from the wafer W from intruding toward the second shaping aperture 89 side from the control electrode 91. As a result, it is possible to suppress contamination and charging of the surfaces of the lens and deflection electrodes, which cause problems in the prior art, thus making it possible to increase the efficiency with which electrons are detected by the secondary electron detector 33.

The laser displacement sensor 99 measures the distance between the wafer W and the demagnification optical projection system 120 by the generation of a laser beam that is incident at an angle on the upper surface of the wafer W. To ensure that this laser beam is not obstructed, the yoke of the objective lens 65 is machined to have a forward surface in a conical shape, or a hole or slit provided therein for the laser beam to pass therethrough.

The trajectory of the electron beam EB is described briefly below. First of all, the electron beam EB is generated at a low acceleration from the electron gun 11. After passing through the first aperture 13, the electron beam EB shines onto the opening of the first shaping aperture 85 while the magnification thereof is adjusted by the two illumination lenses 15a and 15b. The electron beam EB that has passed through the illumination lens 15 starts as a rectangular beam starting at the first shaping aperture 85, and is projected onto the second shaping aperture 89 by the projection lens 87. The incident position of the electron beam EB on the second shaping aperture 89 is controlled by the shaping deflector 17 under the control of the control computer 10, via a power source (not shown in the figure), in such a manner that a beam pattern shape as a target and the surrounding area thereof are irradiated in accordance with CAD data.

The electron beam EB that has passed through the shaping deflector 17, the second shaping aperture 89, and the second shaping deflector 21 starts as a cell pattern beam starting at the second shaping aperture 89, and passes through the reduction lens 63 after being reflected back along the optical axis of the optical system by the second shaping deflector 21.

Figure 2:
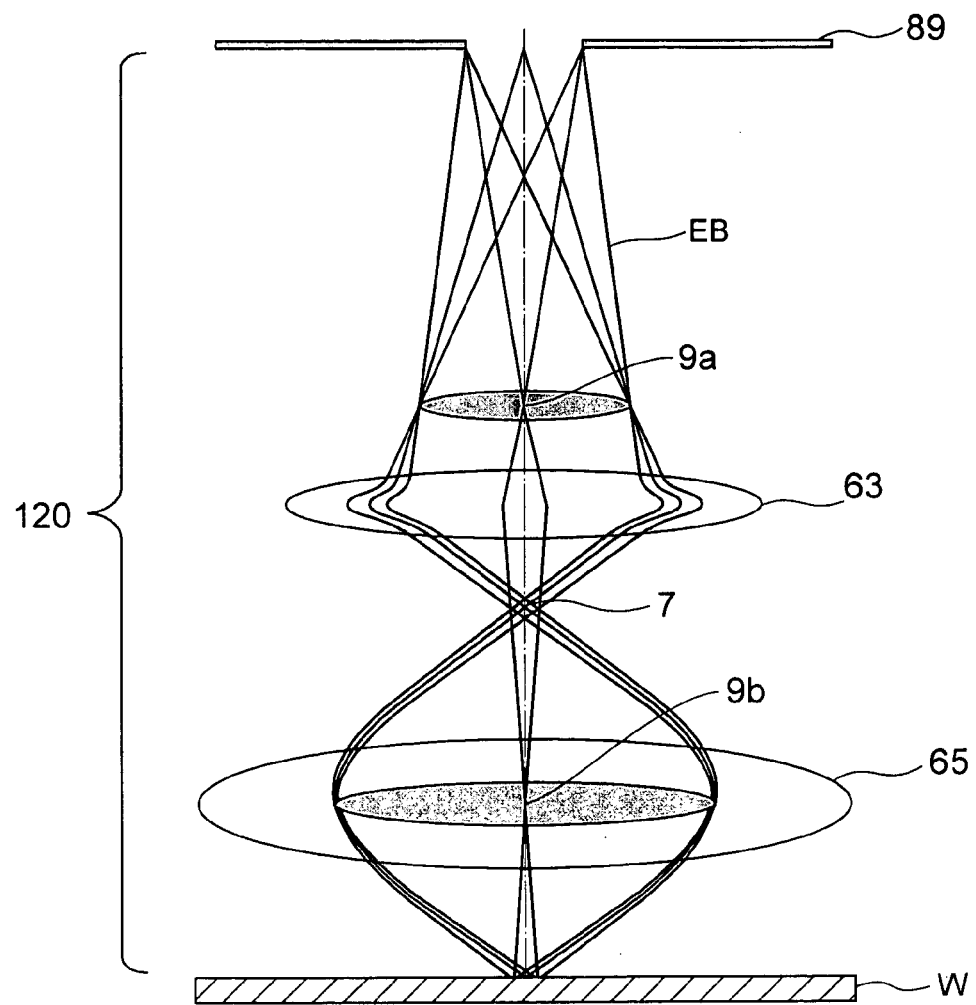
FIG. 2 shows a trajectories of cell pattern beams in the charged particle beam device of FIG. 1.

The beam trajectory of the cell pattern beam that uses the second shaping aperture 89 as a starting point is shown in FIG. 2. As shown in this figure, the cell pattern beam is demagnified by the reduction lens 63 after a first crossover 9a is formed between the second shaping aperture 89 and the reduction lens 63. After that beam has been focused into its smallest diameter in the vicinity of an imaging position of the reduction lens 63, it passes through pre-main deflector 96, the sub deflector 93, the main deflector 95 and the post-main deflector 97 (see FIG. 1). In addition, a second crossover 9b is formed in the vicinity of the center of the objective lens 65, and then the beam is projected onto the upper surface of the wafer W by the objective lens 65.

A first characteristic of the electron beam drawing system 1 of this embodiment is that the control computer 10 adjusts the voltage of power sources 42 and 43 to be applied to the illumination lenses 15a and 15b, respectively, which causes adjustment of the illumination condition onto the second shaping aperture 89 in such a manner that the crossover 9a and the crossover 9b are each larger than the size of the opening of the second shaping aperture 89. As a result, the blurriness of the focus due to the space charge effect can be greatly reduced in comparison with the prior art.

A second characteristic of the electron beam drawing system 1 is that the electronic optical system has a greatly reduced configuration, which reduces the beam blurriness due to the space charge effect when a large current flows. For example, the electronic optical system of the demagnification projection optical system 120 of the electron beam drawing system 1 has a total magnification of 1/4 under conditions of an acceleration voltage of 5 kV and a current of 100 nA. This ensures that the blurriness of the beam on the wafer W is within 100 nm. The blurriness of the beam can be made smaller by making the magnification of the reduction lens 63 less than that of the objective lens 65, and it can be reduced even further by setting the magnification of the objective lens 65 to less than 1. Under the above-described conditions of the acceleration voltage and current by way of example, the magnification of the reduction lens 63 is set to 1/4 and that of the objective lens 65 is set to 4/5, and thus the total magnification is 1/5.

A third characteristic of the electron beam drawing system 1 is the configuration of the reduction lens 63 as an electrostatic type of lens and the objective lens 65 as an electromagnetic type of lens. As a result, the beam blurriness is removed which has conventionally been caused by deceleration of the beam by the reduction lens 63. A fourth characteristic of the electron beam drawing system 1 lies in that the inside diameter of the lower polepiece of the objective lens 65 is greater than the inside diameter of the upper polepiece thereof, so that the magnetic field excited by the objective lens 65 exudes toward the wafer W side. This reduces beam blurriness even further. Note that if a electrostatic type of lens of a deceleration mode is used as the reduction lens 63, in which a voltage of a polarity that decelerates the incident beam is applied to an intermediate electrode, reducing the inside diameter and also shortening the length of the lens to shorten the optical path length along which the beam is decelerated makes it possible to further reduce the beam blurriness.

Still another characteristic of the electron beam drawing system 1 is the way in which the voltages applied to each of the pre-main deflector 96, the main deflector 95, and the post-main deflector 97 are controlled by the control computer 10. These deflectors control the position of the electron beam with respect to the position of the pattern to be drawn, so that the voltage applied to the pre-main deflector 96 is controlled in the additive direction with respect to the voltage applied to the main deflector 95, and the voltage applied to the post-main deflector 97 is controlled in the subtractive direction with respect to the voltage applied to the main deflector 95. Any changes in the pattern shape and dimensions caused by even slight changes in the distance between the wafer W and the electronic optical system are minimized by minimizing deflection errors by adjusting the relative deflection voltages of the pre-main deflector 96, the main deflector 95, and the post-main deflector 97, and also controlling the trajectory of the electron beam EB in such a manner that it is incident perpendicularly on the surface of the wafer W.

Figure 3:
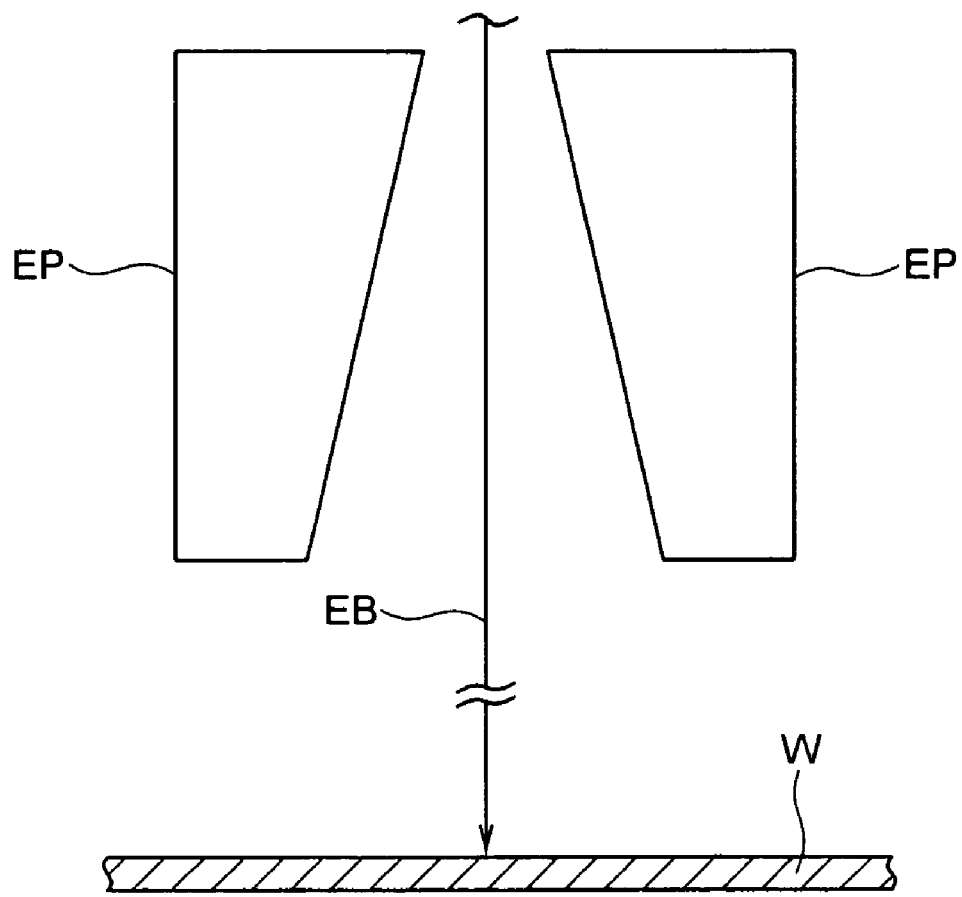
FIG. 3 shows an end face view of a specific example of an electrode with an inside wall in inverted-tapered shape.

It is possible to reduce deflection aberration while retaining a high deflection sensitivity by forming an inverted taper such that the inside diameters of the electrodes of the pre-main deflector 96, the main deflector 95, and the post-main deflector 97 increase with distance along the axis towards the wafer W side by the deflection of the electron beam EB, or by broadening the inside diameters of the electrodes towards the wafer W side, as shown by an electrode EP illustrated in an end face view through a plane parallel to the optical axis of the electron beam EB in FIG. 3.

The implementation of the pattern drawing method in accordance with the present invention using the electron beam lithography system 1 shown in FIG. 1 makes it possible to draw a pattern on a substrate with a high-resolution electron beam that has an extremely low level of beam blurriness, thus making it possible to manufacture semiconductor devices with high levels of throughput and yield.

What is claimed is:

1. A charged particle beam lithography system comprising:
   a charged particle beam source which generates a charged particle beam and irradiates a substrate therewith;
   an aperture in which has been formed a pattern of a shape corresponding to an arbitrary pattern to be drawn;
   an illuminator which adjusts the diameter of the charged particle beam and illuminates said aperture with the charged particle beam;
   a first deflector which deflects the charged particle beam by an electrical field to cause the charged particle beam to be incident on an arbitrary pattern, allowing the charged particle beam to pass through said aperture and be reflected back along the optical axis;
   a first demagnification optical projection system which demagnifies the aperture image of the charged particle beam which has passed through said aperture with the use of an electrical field or electromagnetic field;
   a second demagnification optical projection system which demagnifies the aperture image of the charged particle beam which has been demagnified by said first demagnification projection optical system, with the use of an electrical field or electromagnetic field to form an image on the substrate; and
   a beam diameter adjuster which adjusts said illuminator in such a manner that the beam diameter at crossovers of the charged particle beam, formed between said aperture and said first demagnification optical projection system and within said second demagnification optical projection system, is greater than the size of said pattern.

2. A charged particle beam lithography system comprising:
   a charged particle beam source which generates a charged particle beam and irradiates a substrate therewith;
   an aperture in which has been formed a pattern of a shape corresponding to an arbitrary pattern to be drawn;
   an illuminator which adjusts the diameter of the charged particle beam and illuminates said aperture with the charged particle beam;
   a first deflector which deflects the charged particle beam by an electrical field to cause the charged particle beam to be incident on an arbitrary pattern, allowing the charged particle beam to pass through said aperture and be reflected back along the optical axis;
   a first demagnification optical projection system which demagnifies the aperture image of the charged particle beam which has passed through said aperture with the use of an electrical field or electromagnetic field;
   a second demagnification optical projection system which demagnifies the aperture image of the charged particle beam which has been demagnified by said first demagnification projection optical system, with the use of an electrical field or electromagnetic field to form an image on the substrate; and
   a beam diameter adjuster which adjusts said illuminator in such a manner that the beam diameter at crossovers of the charged particle beam, formed between said aperture and said first demagnification optical projection system and within said second demagnification optical projection system, is greater than the size of said pattern, wherein
   assuming that the demagnification of said aperture image by said first demagnification optical projection system is M1 and the demagnification of said aperture image by said second demagnification optical projection system is M2, M1 and M2 satisfy the following inequalities:
   $M1 \times M2 \leq 1/4$, $M1 \leq M2$, and $M2 \leq 1$.

3. The charged particle beam lithography system according to claim 1, wherein:
   the charged particle beam source generates the charged particle beam at an acceleration voltage that is lower than the voltage at which a proximity effect is caused, said proximity effect being a phenomenon in which rearward scattered electrons generated within the substrate by the irradiation of the charged particle beam affect the exposure of the pattern to be drawn in the vicinity of the position at which the charged particle beam is incident.

4. The charged particle beam lithography system according to claim 1, further comprising:
   a second deflector which deflects the charged particle beam by an electrical field to scan the surface of the substrate;
   a secondary electron detector which detects secondary electrons generated from the substrate by the irradiation of the charged particle beam; and
   a secondary electron controller disposed between said second deflector and the substrate to prevent the intrusion of said secondary electrons into the side of said aperture beyond said secondary electron controller.

5. The charged particle beam lithography system according to claim 4, wherein:
   a first potential is applied to the substrate; and
   said secondary electron controller includes an electrode to which a second potential that is even lower than that of first potential is applied.

6. A charged particle beam lithography system comprising:
   a charged particle beam source which generates a charged particle beam and irradiates a substrate therewith;
   an aperture in which has been formed a pattern of a shape corresponding to an arbitrary pattern to be drawn;

an illuminator which adjusts the diameter of the charged particle beam and illuminates said aperture with the charged particle beam;

a first deflector which deflects the charged particle beam by an electrical field to cause the charged particle beam to be incident on an arbitrary pattern, allowing the charged particle beam to pass through said aperture and be reflected back along the optical axis;

a first demagnification optical projection system which demagnifies the aperture image of the charged particle beam which has passed through said aperture with the use of an electrical field or electromagnetic field;

a second demagnification optical projection system which demagnifies the aperture image of the charged particle beam which has been demagnified by said first demagnification projection optical system, with the use of an electrical field or electromagnetic field to form an image on the substrate;

a beam diameter adjuster which adjusts said illuminator in such a manner that the beam diameter at crossovers of the charged particle beam, formed between said aperture and said first demagnification optical projection system and within said second demagnification optical projection system, is greater than the size of said pattern;

a second deflector which deflects the charged particle beam by an electrical field to scan the surface of the substrate;

a secondary electron detector which detects secondary electrons generated from the substrate by the irradiation of the charged particle beam; and a secondary electron controller disposed between said second deflector and the substrate to prevent the intrusion of said secondary electrons into the side of said aperture beyond said secondary electron controller, wherein said second deflector has an electrode of an inverted taper shape with an inner wall that increases in diameter with proximity to the substrate.

7. The charged particle beam lithography system according to claim 1, wherein:

said first demagnification optical projection system is configured of an electrostatic lens; and said second demagnification optical projection system is configured of a magnetic lens.

8. A charged particle beam lithography system comprising:

a charged particle beam source which generates a charged particle beam and irradiates a substrate therewith;

an aperture in which has been formed a pattern of a shape corresponding to an arbitrary pattern to be drawn;

an illuminator which adjusts the diameter of the charged particle beam and illuminates said aperture with the charged particle beam;

a first deflector which deflects the charged particle beam by an electrical field to cause the charged particle beam to be incident on an arbitrary pattern, allowing the charged particle beam to pass through said aperture and be reflected back along the optical axis;

a first demagnification optical projection system which demagnifies the aperture image of the charged particle beam which has passed through said aperture with the use of an electrical field or electromagnetic field, wherein said first demagnification optical projection system is configured of an electrostatic lens;

a second demagnification optical projection system which demagnifies the aperture image of the charged particle beam which has been demagnified by said first demagnification projection optical system, with the use of an electrical field or electromagnetic field to form an image on the substrate, wherein said second demagnification optical projection system is configured of a magnetic lens, wherein said magnetic lens is configured by a lens having a pole-piece with a pole on said aperture side and a pole on the substrate side, the inside diameter of the pole on the substrate being greater than that of the pole on said aperture side; and a beam diameter adjuster which adjusts said illuminator in such a manner that the beam diameter at crossovers of the charged particle beam, formed between said aperture and said first demagnification optical projection system and within said second demagnification optical projection system, is greater than the size of said pattern.

9. A pattern drawing method using a charged particle beam, said method comprising:

generating a charged particle beam and irradiating a substrate therewith;

shining the charged particle beam onto an aperture on which is formed a pattern of a shape corresponding to an arbitrary pattern to be drawn, by adjusting the diameter of the charged particle beam;

causing the charged particle beam to be incident on said arbitrary pattern by deflecting the charged particle beam by an electrical field, and returning the charged particle beam that has passed through said aperture back along the optical axis thereof;

demagnifying the aperture image of the charged particle beam that has passed through said aperture by a first demagnification with the use of an electrical field or magnetic field;

further demagnifying said aperture image that has been demagnified by said first demagnification, by a second demagnification with the use of an electrical field or magnetic field; and adjusting the diameter of the charged particle beam in such a manner that the diameter of a crossover of the charged particle beam that is formed between passing through said aperture and irradiating the substrate is greater than the dimensions of said pattern.

10. A pattern drawing method comprising:

generating a charged particle beam and irradiating a substrate therewith;

shining the charged particle beam onto an aperture on which is formed a pattern of a shape corresponding to an arbitrary pattern to be drawn, by adjusting the diameter of the charged particle beam;

causing the charged particle beam to be incident on said arbitrary pattern by deflecting the charged particle beam by an electrical field, and returning the charged particle beam that has passed through said aperture back along the optical axis thereof;

demagnifying the aperture image of the charged particle beam that has passed through said aperture by a first demagnification with the use of an electrical field or magnetic field;

further demagnifying said aperture image that has been demagnified by said first demagnification, by a second demagnification with the use of an electrical field or magnetic field; and adjusting the diameter of the charged particle beam in such a manner that the diameter of a crossover of the charged particle beam that is formed between passing through said aperture and irradiating the substrate is greater than the dimensions of said pattern, wherein assuming that said first demagnification is M1 and said second demagnification is M2, M1 and M2 satisfy the following inequalities:

$M1 \times M2 \leq 1/4$, $M1 \leq M2$, and $M2 \leq 1$.

11. The pattern drawing method according to claim 9, wherein:
the charged particle beam is generated by an acceleration voltage that is lower than the voltage at which a proximity effect is caused, said proximity effect being a phenomenon in which rearward scattered electrons generated within the substrate by the irradiation of the charged particle beam affect the exposure of the pattern to be drawn in the vicinity of the position at which said charged 2 particle beam is incident.

12. The pattern drawing method according to claim 9, further comprising:
deflecting the charged particle beam with an electrical field to scan a surface of the substrate with the charged particle beam;
detecting secondary electrons that are generated from the substrate by the irradiation of the charged particle beam; and
preventing said secondary electrons from intruding into the deflecting electrical field for scanning the substrate, between said deflecting electrical field for scanning the substrate and the substrate.

13. The pattern drawing method according to claim 12, wherein:
a first potential is applied to the substrate; and
said intrusion of said secondary electrons into a deflecting electrical field for scanning the substrate is prevented by exciting an electrostatic field by a second potential that is even lower than that of said first potential.

14. The pattern drawing method according to claim 9, wherein:
the aperture image of the charged particle beam is demagnified at said first demagnification by an electrostatic field; and
the aperture image of the charged particle beam is demagnified at said second demagnification by a magnetic field.

15. A method of manufacturing a semiconductor device comprising a pattern drawing method using a charged particle beam, said pattern drawing method including:
generating a charged particle beam and irradiating a substrate therewith;
shining the charged particle beam onto an aperture on which is formed a pattern of a shape corresponding to an arbitrary pattern to be drawn, by adjusting the diameter of the charged particle beam;
causing the charged particle beam to be incident on said arbitrary pattern by deflecting the charged particle beam by an electrical field, and returning the charged particle beam that has passed through said aperture back alone the optical axis thereof;
demagnifying the aperture image of the charged particle beam that has passed through said aperture by a first demagnification with the use of an electrical field or magnetic field;
further demagnifying said aperture image that has been demagnified by said first demagnification, by a second demagnification with the use of an electrical field or magnetic field; and
adjusting the diameter of the charged particle beam in such a manner that the diameter of a crossover of the charged particle beam that is formed between passing through said aperture and irradiating the substrate is greater than the dimensions of said pattern.

16. A method of manufacturing a semiconductor device comprising a pattern drawing method using a charged particle beam, said pattern drawing method including:
generating a charged particle beam and irradiating a substrate therewith;
shining the charged particle beam onto an aperture on which is formed a pattern of a shape corresponding to an arbitrary pattern to be drawn, by adjusting the diameter of the charged particle beam;
causing the charged particle beam to be incident on said arbitrary pattern by deflecting the charged particle beam by an electrical field, and returning the charged particle beam that has passed through said aperture back alone the optical axis thereof;
demagnifying the aperture image of the charged particle beam that has passed through said aperture by a first demagnification with the use of an electrical field or magnetic field;
further demagnifying said aperture image that has been demagnified by said first demagnification, by a second demagnification with the use of an electrical field or magnetic field; and
adjusting the diameter of the charged particle beam in such a manner that the diameter of a crossover of the charged particle beam that is formed between passing through said aperture and irradiating the substrate is greater than the dimensions of said pattern, wherein
assuming that said first demagnification is M1 and said second demagnification is M2, M1 and M2 satisfy the following inequalities:
$M1 \times M2 \leq 1/4$, $M1 \leq M2$, and $M2 \leq 1$.

17. The method of manufacturing a semiconductor device according to claim 15, wherein
the charged particle beam is generated by an acceleration voltage that is lower than the voltage at which a proximity effect is caused, said proximity effect being a phenomenon in which rearward scattered electrons generated within the substrate by the irradiation of the charged particle beam affect the exposure of the pattern to be drawn in the vicinity of the position at which said charged 2 particle beam is incident.

18. The method of manufacturing a semiconductor device according to claim 15, wherein said pattern drawing method further comprising:
deflecting the charged particle beam with an electrical field to scan a surface of the substrate with the charged particle beam;
detecting secondary electrons that are generated from the substrate by the irradiation of the charged particle beam; and
preventing said secondary electrons from intruding into the deflecting electrical field for scanning the substrate, between said deflecting electrical field for scanning the substrate and the substrate.

19. The method of manufacturing a semiconductor device according to claim 18, wherein
a first potential is applied to the substrate; and
said intrusion of said secondary electrons into a deflecting electrical field for scanning the substrate is prevented by exciting an electrostatic field by a second potential that is even lower than that of said first potential.

20. The method of manufacturing a semiconductor device according to claim 15, wherein
the aperture image of the charged particle beam is demagnified at said first demagnification by an electrostatic field; and
the aperture image of the charged particle beam is demagnified at said second demagnification by a magnetic field.

* * * * *

UNITED STATES PATENT AND TRADEMARK OFFICE
CERTIFICATE OF CORRECTION

PATENT NO. : 7,109,501 B2 Page 1 of 1
APPLICATION NO. : 10/959508
DATED : September 19, 2006
INVENTOR(S) : Nagano et al.

It is certified that error appears in the above-identified patent and that said Letters Patent is hereby corrected as shown below:

Claim 11, column 11, line 10, change "charged 2 particle" to --charged particle--.

\* Claim 16, column 12, line 9, change "alone" to --along--.

Claim 17, column 12, line 36, change "charged 2 particle" to --charged particle--.

Signed and Sealed this

Twenty-third Day of January, 2007

JON W. DUDAS
*Director of the United States Patent and Trademark Office*